United States Patent
Hu

(10) Patent No.: US 12,396,266 B2
(45) Date of Patent: Aug. 19, 2025

(54) ELECTROSTATIC PROTECTION DEVICE INCLUDING SCR AND MANUFACTURING METHOD THEREOF

(71) Applicant: Joulwatt Technology Co., Ltd., Hangzhou (CN)

(72) Inventor: Tao Hu, Hangzhou (CN)

(73) Assignee: JOULWATT TECHNOLOGY CO., LTD., Hangzhou (CN)

( * ) Notice: Subject to any disclaimer, the term of this patent is extended or adjusted under 35 U.S.C. 154(b) by 432 days.

(21) Appl. No.: 18/088,488

(22) Filed: Dec. 23, 2022

(65) Prior Publication Data

US 2023/0207556 A1 Jun. 29, 2023

(30) Foreign Application Priority Data

Dec. 23, 2021 (CN) .......................... 202111620027.7

(51) Int. Cl.
 H10D 89/60 (2025.01)
 H10D 18/00 (2025.01)

(52) U.S. Cl.
 CPC ......... H10D 89/713 (2025.01); H10D 18/251 (2025.01)

(58) Field of Classification Search
 CPC ...... H10D 89/713; H10D 18/251; H10D 8/80; H10D 62/126; H10D 62/108; H10D 18/031; H10D 84/0102; H10D 84/135; H10D 89/611
 See application file for complete search history.

(56) References Cited

U.S. PATENT DOCUMENTS

| | | | |
|---|---|---|---|
| 5,856,214 A | 1/1999 | Yu | |
| 2015/0187749 A1* | 7/2015 | Dai | H10D 18/251 |
| | | | 257/173 |

FOREIGN PATENT DOCUMENTS

| CN | 103354236 | 10/2013 |
|---|---|---|
| CN | 111446242 A | 7/2020 |
| CN | 111584481 | 8/2020 |
| CN | 112490240 | 3/2021 |

* cited by examiner

Primary Examiner — Wasiul Haider
(74) Attorney, Agent, or Firm — Treasure IP Group, LLC

(57) ABSTRACT

The present disclosure relates to an electrostatic protection device including an SCR and a manufacturing method thereof. The electrostatic protection device includes a third N+ doped region across an N-type well region and a P-type well region, and a third P+ doped region adjacent to the third N+ doped region. Each of the third N+ doped region and the third P+ doped region has a high doping concentration. In a case that Zener breakdown occurs in a PN junction structure between the third N+ doped region and the third P+ doped region, the SCR is triggered to form a discharge current path. The present disclosure can reduce a trigger voltage of an electrostatic protection device including an SCR, and can provide electrostatic protection devices having different trigger voltages, with high stability and high robustness.

15 Claims, 7 Drawing Sheets

ELECTROSTATIC PROTECTION DEVICE INCLUDING SCR AND MANUFACTURING METHOD THEREOF

CROSS REFERENCE TO RELATED APPLICATIONS

The present application claims priority to a Chinese patent application filed on Dec. 23, 2021, with application No. 202111620027.7, and entitled "ELECTROSTATIC PROTECTION DEVICE INCLUDING SCR AND MANUFACTURING METHOD THEREOF", the disclosure of which is herein incorporated by reference in its entirety, including specification, claims, attached drawings and abstract.

FIELD OF THE DISCLOSURE

The present disclosure relates to the technical field of integrated circuits, in particular to an electrostatic protection device including an SCR and a manufacturing method thereof.

DESCRIPTION OF THE RELATED ART

ESD (Electro-Static Discharge) is a natural phenomenon which is inevitable and exists in the whole product cycle. In the stages of manufacturing, packaging, testing and application, a chip will accumulate charges in an external environment and in an internal structure and will be threatened by static electricity at any time. Thus, one will use an ESD protection device which is connected to a protected circuit, and is turned off when an internal circuit of the protected circuit operates normally so as not to affect normal functions of the protected circuit. When the ESD occurs, the ESD protection device is turned on before the internal circuit is damaged by the ESD, and the ESD protection device will provide a low-resistance discharge path to prevent an ESD current from flowing into the internal circuit and causing damage.

As an ESD protection device, a silicon controlled rectifier (SCR) is widely used in I/O ports of an IC chip for providing power domain protection. The SCR has the advantages of high robustness and simple manufacturing process. However, the SCR also has some disadvantages such as a high on voltage and a low maintenance voltage, and cannot play a good role in protecting gate oxide layers of MOS transistors at an input and output terminals of the integrated circuit.

As shown in FIG. 1, it is a structural schematic diagram of a traditional SCR for ESD protection. Generally, an I/O port of the protected integrated circuit chip is connected to an anode of the SCR, and a cathode of the SCR is connected to a reference ground. When an internal circuit of the protected integrated circuit chip is in a normal operating state, a voltage on the I/O port is insufficient to cause avalanche breakdown of a reverse PN junction between an N-well (N-well) 20 and a P-well (P-well) 30 of the SCR. Thus, the SCR is in an off state in such case. When the anode of the SCR is subjected to a forward ESD stress, the voltage rises. When the voltage on the anode of the SCR rises to avalanche breakdown of the reverse PN junction between the N well 20 and the P well 30 of the SCR, a current is generated by avalanche breakdown and flow through a well resistance between the N well 20 and the P well 30. A voltage drop on the well resistance turns on a parasitic bipolar transistor of NPN or PNP in the SCR. When the parasitic bipolar transistor is turned on, it generates a current on a collector, and a voltage drop caused by the current will immediately turn on another parasitic bipolar transistor. Finally, the two parasitic bipolar transistors provide an open-circuit positive feedback mechanism, so that the SCR structure is completely turned on to provide a low-resistance path for discharging an ESD current.

However, with scaling down of a critical feature of a CMOS process device, the performance of an integrated circuit product is improved, and a thickness of a gate oxide in the integrated circuit is smaller. A breakdown voltage (BV) decreases significantly, which directly leads to decrease of an upper limit of ESD design window. Because a trigger voltage of a traditional SCR is mainly determined by an avalanche breakdown voltage of a reverse PN junction between N well and P well, the trigger voltage of the traditional SCR is relatively high. Consequently, it is still a challenge to protect gate oxide layers at input and output ports of the integrated circuit for high technological requirements. The traditional SCR cannot meet expected requirements, which limits its applications.

Therefore, it is necessary to provide an improved technical solution to overcome the above technical problems in the prior art.

SUMMARY OF THE DISCLOSURE

In order to solve the above technical problems, the present disclosure provides an electrostatic protection device including an SCR and a manufacturing method thereof, which can reduce a trigger voltage of an electrostatic protection device including the SCR, and can provide electrostatic protection devices having different trigger voltages, and have high stability and high robustness.

According to a first aspect of the present disclosure, there is provided an electrostatic protection device including an SCR is provided, comprising: a substrate;
an N-type well region and a P-type well region in the substrate arranged in order in a lateral direction;
a first N+ doped region and a first P+ doped region in the N-type well region arranged in order with a distance therebetween, wherein both the first N+ doped region and the first P+ doped region are electrically coupled with the anode of the electrostatic protection device including the SCR;
a second N+ doped region and a second P+ doped region in the P-type well region arranged in order and with a distance therebetween, wherein both the second N+ doped region and the second P+ doped region are electrically coupled with the cathode of the electrostatic protection device including the SCR;
a third N+ doped region across the N-type well region and the P-type well region;
a third P+ doped region adjacent to the third N+ doped region,
wherein each of the third N+ doped region and the third P+ doped region has a doping concentration higher than those of the first N+ doped region, the first P+ doped region, the second N+ doped region and the second P+ doped region;
in a case that Zener breakdown occurs in the PN junction structure between the third N+ doped region and the third P+ doped region, an SCR is triggered to form a discharge current path.

Preferably, the shorter a distance between the third N+ doped region and the third P+ doped region, the lower a Zener breakdown voltage of the PN junction structure between the third N+ doped region and the third P+ doped region.

Preferably, the electrostatic protection device further comprises a polysilicon gate arranged on an upper surface of the substrate and between the third N+ doped region and the third P+ doped region, wherein a distance between the third N+ doped region and the third P+ doped region is defined by the polysilicon gate.

Preferably, the distance between the third N+ doped region and the third P+ doped region is equal to a width of the polysilicon gate.

Preferably, the third N+ doped region, the polysilicon gate and the third P+ doped region are arranged in order in a lateral direction, and the third P+ doped region is located in the P-type well region.

Preferably, the third N+ doped region, the polysilicon gate and the third P+ doped region are arranged in order in a longitudinal direction, and each of the third N+ doped region, the polysilicon gate and the third P+ doped region is arranged across the N-type well region and the P-type well region.

Preferably, at least one of the third N+ doped region and the third P+ doped region includes a plurality of doped regions, so that the PN junction structure between the third N+ doped regions and the third P+ doped regions arranged in a longitudinal direction includes a plurality of PN junctions, and, the polysilicon gates are arranged between any adjacent ones of the third N+ doped regions and the third P+ doped regions.

Preferably, the electrostatic protection device including the SCR further comprises isolation structures which isolate the first N+ doped region from the first P+ doped region, isolate the first P+ doped region from the third N+ doped region, isolate the third P+ doped region from the second N+ doped region, and isolate the second N+ doped region from the second P+ doped region, wherein the isolation structures are ones selected from a group consisting of a field oxide structure and a shallow trench isolation structure.

According to a second aspect of the present disclosure, there is provided a manufacturing method of an electrostatic protection device including an SCR is provided, comprising:

providing a substrate;

forming an N-type well region and a P-type well region in the substrate, which are arranged in order in a lateral direction;

forming an isolation structure;

forming a first N+ doped region and a first P+ doped region in the N-type well region;

forming a second N+ doped region and a second P+ doped region in the P-type well region;

forming a third N+ doped region across the N-type well region and the P-type well region, and a third P+ doped region adjacent to the third N+ doped region, wherein each of the third N+ doped region and the third P+ doped region has a doping concentration higher than those of the first N+ doped region, the first P+ doped region, the second N+ doped region and the second P+ doped region.

Preferably, forming a third N+ doped region across the N-type well region and the P-type well region, and a third P+ doped region adjacent to the third N+ doped region comprises:

forming a polysilicon gate on an upper surface of the substrate;

forming the third N+ doped region and the third P+ doped region on opposite sides of the polysilicon gate in a self-aligned process, wherein a distance between the third N+ doped region and the third P+ doped region is defined by the polysilicon gate.

Preferably, the distance between the third N+ doped region and the third P+ doped region is equal to a width of the polysilicon gate.

Preferably, the third N+ doped region, the polysilicon gate and the third P+ doped region are arranged in order in a lateral direction, and the third P+ doped region is formed in the P-type well region.

Preferably, the third N+ doped region, the polysilicon gate and the third P+ doped region are arranged in order in a longitudinal direction, and each of the third N+ doped region, the polysilicon gate and the third P+ doped region is arranged across the N-type well region and the P-type well region.

Preferably, a plurality of polysilicon gates are formed on the upper surface of the substrate, and opposite sides of each of the plurality of polysilicon gates are respectively provided with a third N+ doped region and a third P+ doped region formed by a gate self-aligned process.

Preferably, the isolation structure is a field oxide structure or a shallow trench isolation structure.

The beneficial effects of the present disclosure include at least:

The present disclosure relates to some embodiments of an electrostatic protection device including the SCR and a manufacturing method thereof. A third N+ doped region and a third P+ doped region are formed additionally in a conventional electrostatic protection device including an SCR (referred to as SCR device for short herein) structure. The third N+ doped region is arranged across a P-type well region and an N-type well. The third P+ doped region is adjacent to the third N+ doped region. Each of the third N+ doped region and the third P+ doped region has a high doping concentration. Furthermore, a PN junction structure (i.e., a Zener diode structure) between the third N+ doped region with high concentration and the third P+ doped region with high concentration is formed in the electrostatic protection device including the SCR. A current is generated during Zener breakdown of the third N+ doped region with high concentration and the third P+ doped region with high concentration and is used to assist trigger the SCR to form a discharge current path. In this process, a breakdown voltage required by Zener breakdown is lower than that required by avalanche breakdown, and effectively reduces a trigger voltage of the SCR. The whole device has simple structure, high stability and robustness, and has a good application prospect.

In a further preferable embodiment, the third N+ doped region with high concentration and the third P+ doped region with high concentration are formed on opposite sides of a polysilicon gate by a self-aligned process after the polysilicon gate is deposited. Thus, a distance between the third N+ doped region with high concentration and the third P+ doped region with high concentration is accurately defined, which is helpful for obtaining more accurate Zener breakdown voltage. Meanwhile, the distance between the third N+ doped region with high concentration and the third P+ doped region with high concentration can be accurately and stably changed by varying a width of the polysilicon gate. Therefore, the SCR device has the characteristics of high stability and high robustness, and has a trigger voltage (i.e. a Zener breakdown voltage) (i.e. a Zener breakdown voltage) that can be adjusted accurately and stably, which enhances application scenarios of the SCR device.

In a further preferable embodiment, all of the third N+ doped region, the polysilicon gate and the third P+ doped region are arranged in a longitudinal direction across the N-type well region and the P-type well region. An area of the SCR device can be further reduced and the miniaturization of the device can be facilitated.

It should be noted that the above general description and the following detailed description are only exemplary and explanatory and are not limiting to the present disclosure.

DETAILED DESCRIPTION OF EMBODIMENTS OF THE DISCLOSURE

Figure 1:
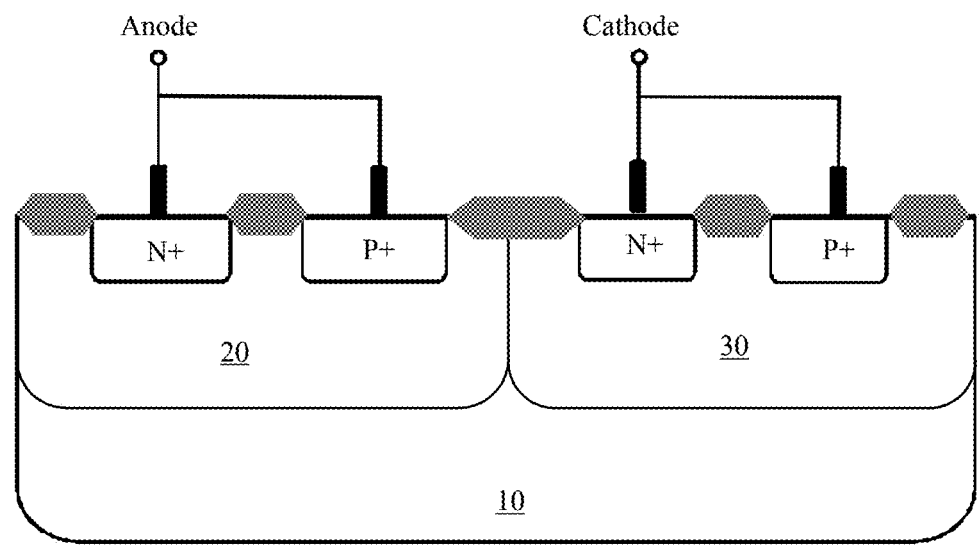
FIG. 1 shows a cross-sectional front view of a conventional electrostatic protection device including an SCR.

For ease of understanding the present disclosure, a more complete description of the present disclosure will be given below with reference to the associated drawings. Preferred embodiments of the present disclosure are given in the drawings. However the present disclosure may be implemented in different forms and is not limited to the embodiments described herein. Rather these embodiments are provided to enable a more thorough and comprehensive understanding of the disclosure of the present disclosure.

Embodiment 1

Figure 2:
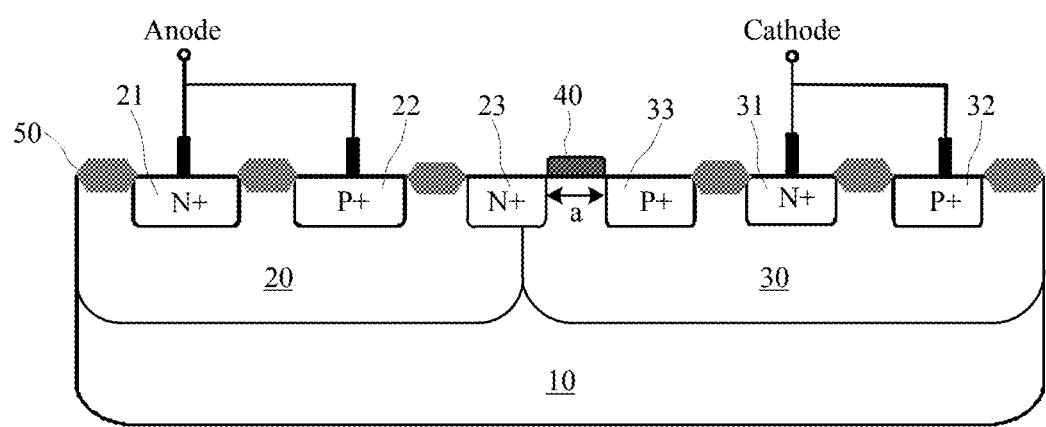
FIG. 2 shows a cross-sectional front view of an electrostatic protection device including an SCR according to a first embodiment of the present disclosure.
Figure 3:
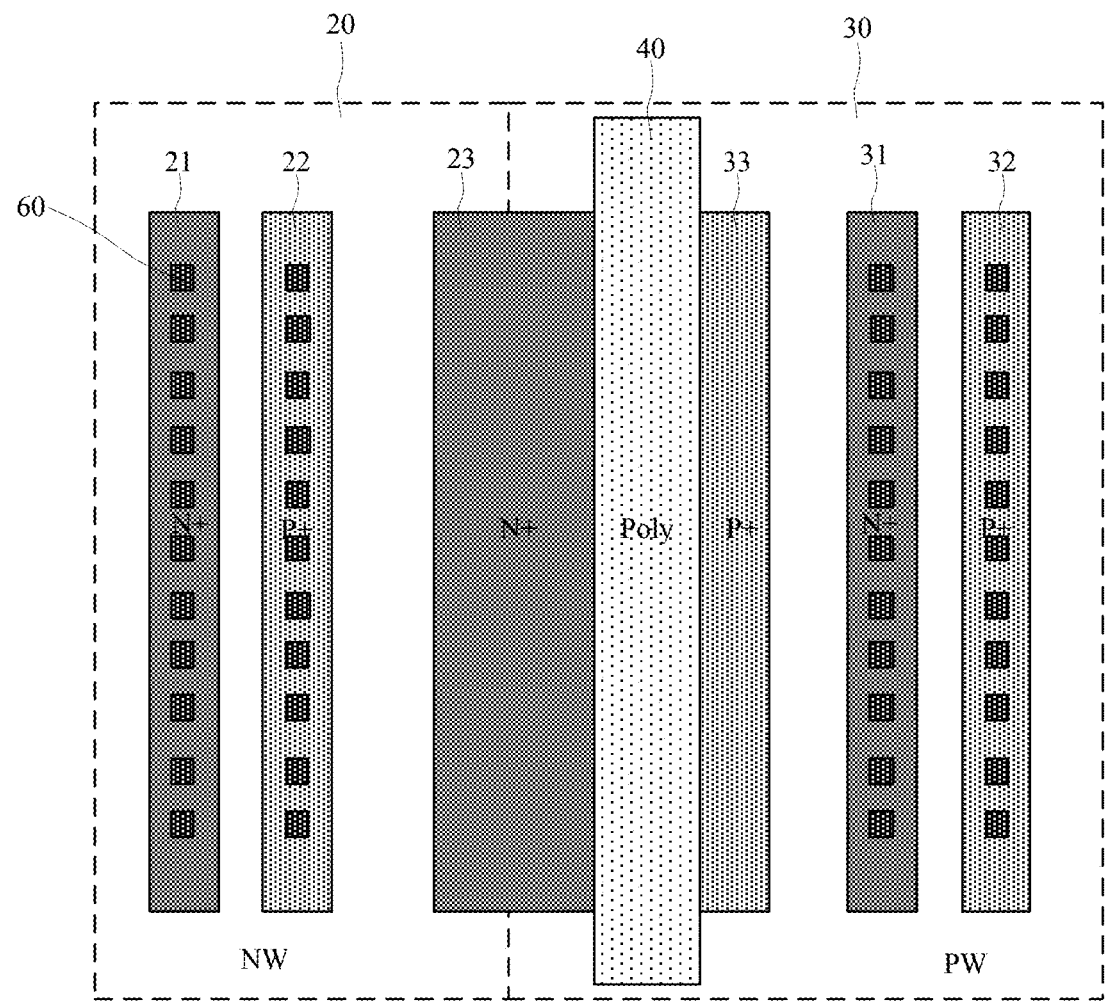
FIG. 3 shows a cross-sectional top view of an electrostatic protection device including an SCR according to a first embodiment of the present disclosure.

As shown in FIG. 2 and FIG. 3, an electrostatic protection device including an SCR according to a first embodiment of the present disclosure includes a substrate 10 and an N-type well region 20 and a P-type well region 30 in the substrate 10 in order in a lateral direction.

In the N-type well region 20, a first N+ doped region 21 and a first P+ doped region 22 are arranged in order in a lateral direction with a distance therebetween, and each of the first N+ doped region 21 and the first P+ doped region 22 is connected to an anode of the electrostatic protection device including the SCR through a plurality of electrodes 60. In the P-type well region 30, a second N+ doped region 31 and a second P+ doped region 32, each of which is connected to a cathode of the electrostatic protection device including the SCR through a plurality of electrodes 60, are arranged in order in a lateral direction with a distance therebetween. It can be understood that the first N+ doped region 21, the first P+ doped region 22, and the N-type well region 20 together constitute a parasitic bipolar transistor of NPN of the electrostatic protection device including the SCR, and the second P+ doped region 32, the second N+ doped region 31, and the P-type well region 30 together constitute a parasitic bipolar transistor of PNP of the electrostatic protection device including the SCR. The parasitic bipolar transistor of NPN and the parasitic bipolar transistor of PNP together constitute an SCR structure for electrostatic protection, and the SCR structure can form an SCR path of PNPN or NPNP and discharge an ESD current when the parasitic bipolar transistor of NPN and the parasitic bipolar transistor of PNP are simultaneously turned on.

Further, the electrostatic protection device including the SCR according to an embodiment of the present disclosure further includes a third N+ doped region 23 across the N-type well region 20 and the P-type well region 30 and a third P+ doped region 33 adjacent to the third N+ doped region 23.

The third N+ doped region 23 and the third P+ doped region 33 are heavily doped. That is, doping concentrations of the third N+ doped region 23 and the third P+ doped region 33 are higher than those of the first N+ doped region 21, the first P+ doped region 22, the second N+ doped region 31 and the second P+ doped region 32, so that the third N+ doped region 23 and the third P+ doped region 33 are heavily doped to form a PN junction structure with a high doping concentration (i.e., a parasitic Zener diode structure). When Zener breakdown occurs in the PN junction structure between the third N+ doped region 23 and the third P+ doped region 33, a breakdown current flows in a horizontal direction parallel to an upper surface of the substrate 10. A voltage drop is generated when the breakdown current flows through a well resistance, which turns on the parasitic bipolar transistor of NPN or the parasitic bipolar transistor of PNP. When one parasitic bipolar transistor is turned on, a voltage drop due to its collector current will immediately turn on the other parasitic bipolar transistor. Finally, two parasitic bipolar transistors operate in an open-circuit positive feedback mechanism, so that the SCR structure in the electrostatic protection device is completely turned on. A low-resistance ESD current path is formed so as to provide electrostatic protection for the protected integrated circuit.

It can be understood that Zener breakdown typically occurs in a PN junctions with a high doping concentration. That is, when a reverse voltage across the PN junction increases to a certain value, a strong electric field can be established in a barrier region of the PN junction. This electric field can directly pull out valence electrons in covalent bonds. A large number of electron-hole pairs are generated in the barrier region of the PN junction, which forms a large reverse current and causes breakdown (because the PN junction with a higher doping concentration has a space charge region with a large charge density and a small width, even when a small reverse voltage is applied to the PN junction with a high doping concentration, a strong electric field can be established and Zener breakdown can occur). Therefore, the present disclosure can effectively reduce a trigger voltage of the electrostatic protection device, and the whole device has simple structure, high stability and robustness, and has a good application prospect.

Further, in this embodiment, the breakdown current, which is generated when Zener breakdown occurs in the PN junction structure between the third N+ doped region 23 and the third P+ doped region 33, is parallel to the upper surface of the substrate 10, i.e. a direction of the well resistance. Furthermore, the breakdown current, which is generated when Zener breakdown occurs in the PN junction, will flow through the well resistance to the greatest extent to generate a large voltage drop. When the voltage drop is applied to the parasitic bipolar transistor, a conduction degree of the parasitic bipolar transistor can be increased, which further enhances the discharge ability of ESD current and optimizes the electrostatic protection ability of the electrostatic protection device including the SCR.

In this embodiment, the shorter a distance a between the third N+ doped region 23 and the third P+ doped region 33, the lower a Zener breakdown voltage of the PN junction structure between the third N+ doped region 23 and the third P+ doped region 33. For example, in an alternative embodiment of the present disclosure, the Zener breakdown voltage of the PN junction structure between the third N+ doped region 23 and the third P+ doped region 33 is proportional to the distance a between the third N+ doped region 23 and the third P+ doped region 33, for example. It can be understood that the larger a charge density and the smaller a width of the space charge region of the PN junction with a high doping concentration, which corresponds to the distance a between the third N+ doped region 23 and the third P+ doped region 33 in this embodiment, the lower a reverse voltage required to be applied when Zener breakdown occurs.

Further, the electrostatic protection device including the SCR according to an embodiment of the present disclosure further includes a polysilicon gate 40 on an upper surface of the substrate 10 and located between the third N+ doped region 23 and the third P+ doped region 33. The distance a between the third N+ doped region 23 and the third P+ doped region 33 is defined by the polysilicon gate 40. Referring to FIGS. 2 and 3, it can be seen that in the electrostatic protection device including the SCR provided in this embodiment, the third N+ doped region 23, the polysilicon gate 40 and the third P+ doped region 33 are arranged in order in a lateral direction, and the third P+ doped region 33 is located in the P-type well region 30.

A value of the distance a in electrostatic protection device including SCRs is generally small, and a Zener breakdown voltage of the PN junction structure between the third N+ doped region 23 and the third P+ doped region 33 is sensitive to a change of the value of the distance a. Therefore, etching and implantation of active regions of the third N+ doped region 23 and the third P+ doped region 33 will vary due to fluctuation of the process, which will lead to a large deviation in a Zener breakdown voltage of the finally formed electrostatic protection device including SCR. To solve this problem, for example, in this embodiment, a polysilicon gate 40 may be deposited on an upper surface of the substrate 10, which has a predetermined width in accordance with a desired distance a, and then ion implantation may be performed with a predetermined concentration on opposite sides of the polysilicon gate 40 by a gate self-aligned process to form the third N+ doped region 23 and the third P+ doped region 33, respectively. It can be understood that the distance a between the third N+ doped region 23 and the third P+ doped region 33 formed in such a manner is equal to a width of the polysilicon gate 40, so that the distance a can be controlled accurately, which is helpful to obtain more accurate Zener breakdown voltage. Meanwhile, accurate and stable adjustment of the distance a can be achieved by changing the width of the deposited polysilicon gate 40. Electrostatic protection device including SCR can have different trigger voltages by changing the distance a (from a minimum distance a=0), so as to meet requirements of the ESD protection of different operating voltage requirements. Therefore, the SCR device has the characteristics of high stability and high robustness, and has a trigger voltage (i.e. a Zener breakdown voltage) (i.e. a Zener breakdown voltage) that can be adjusted accurately and stably, which enhances application scenarios of the SCR device.

Figure 5:
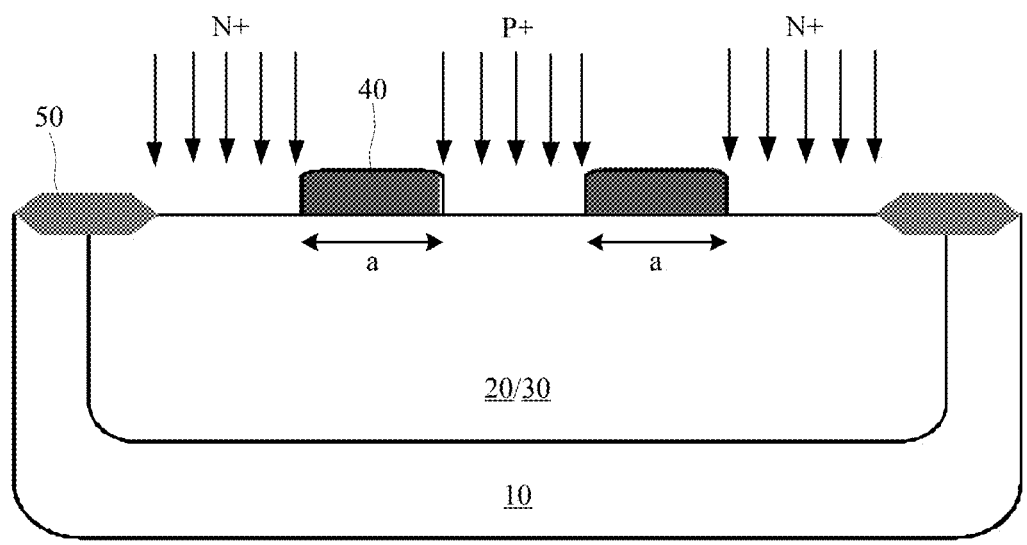
FIG. 5 shows a cross-sectional front view of the electrostatic protection device including the SCR of FIG. 4 during ion implantation along line AA.
Figure 6:
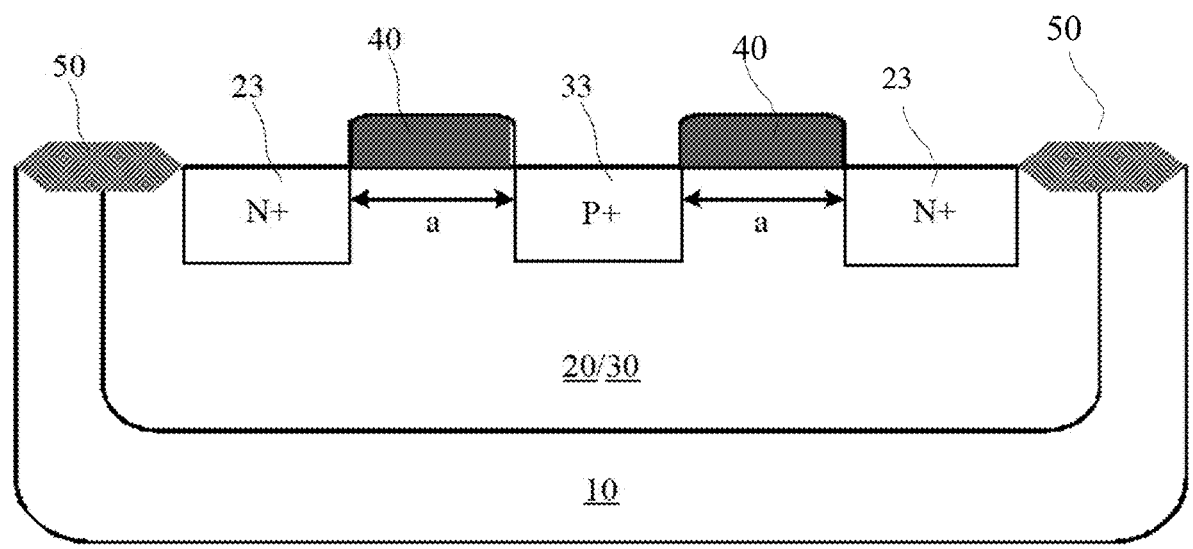
FIG. 6 shows a cross-sectional front view of the electrostatic protection device including the SCR of FIG. 4 along line AA.

Alternatively, as shown in FIGS. 2, 5 and 6, in the present embodiment, between the first N+ doped region 21 and the first P+ doped region 22, between the first P+ doped region 22 and the third N+ doped region 23, between the third P+ doped region 33 and the second N+ doped region 31, and between the second N+ doped region 31 and the second P+ doped region 32 are all isolated by a field oxide structure 50. However, it should be noted that in other embodiments of the present disclosure, the doped regions can also be isolated by a shallow trench isolation structure, which is not limited by the present disclosure.

Embodiment 2

Figure 4:
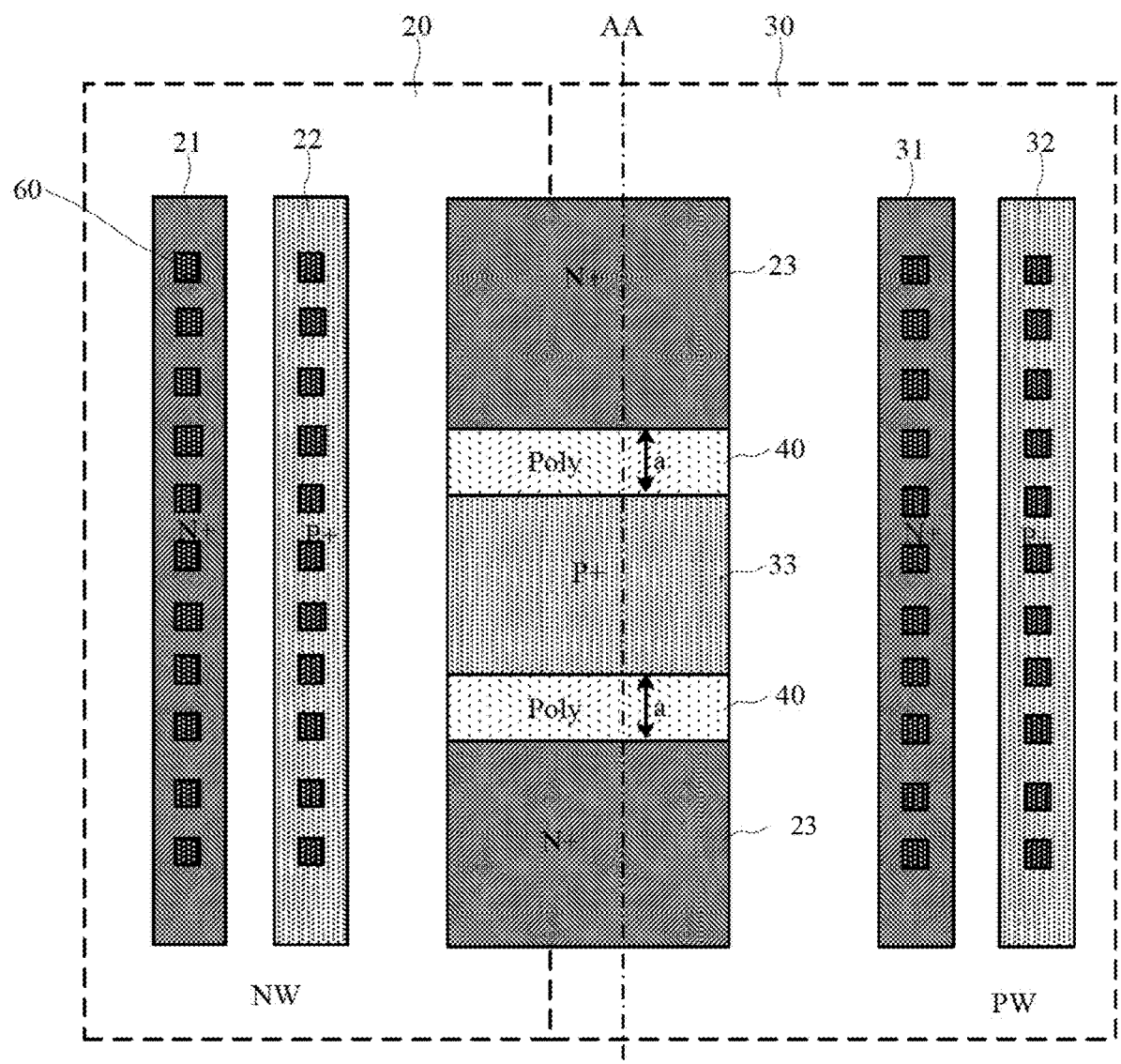
FIG. 4 shows a cross-sectional top view of an electrostatic protection device including an SCR according to a second embodiment of the present disclosure.

The configuration of the electrostatic protection device including the SCR according to a second embodiment of the present disclosure is shown in FIGS. 4, 5 and 6.

In this embodiment, the electrostatic protection device including the SCR basically adopts the same structure as in the above-mentioned first embodiment and the similarities are not described in detail.

The difference is that in the present embodiment, the third N+ doped region 23, the polysilicon gate 40, and the third P+ doped region 33 are arranged in order in a longitudinal direction, and the third N+ doped region 23, the polysilicon gate 40, and the third P+ doped region 33 are all provided across the N-type well region 20 and the P-type well region 30.

Further, in this embodiment, the number of polysilicon gates 40 is plural, and the number of at least one of the third N+ doped regions 23 and the third P+ doped regions 33 is plural, so that the number of PN junction structures between the third N+ doped regions 23 and the third P+ doped regions 33 arranged vertically is plural. The polysilicon gate 40 is provided between any adjacent third N+ doped region 23 and third P+ doped region 33.

In this embodiment, all of the third N+ doped region 23, the polysilicon gate 40, and the third P+ doped region 33 are arranged in a longitudinal direction across the N-type well region 20 and the P-type well region 30. An area of the SCR device can be further reduced and the miniaturization of the device can be facilitated. Meanwhile, a plurality of PN junctions formed in a longitudinal direction can further increase a breakdown current when Zener breakdown occurs. Furthermore, when a parasitic bipolar transistor is turned on, a conduction degree of the parasitic bipolar transistor can be further increased, which further enhances the discharge ability of ESD current and optimizes the electrostatic protection ability of the electrostatic protection device including the SCR.

Figure 7:
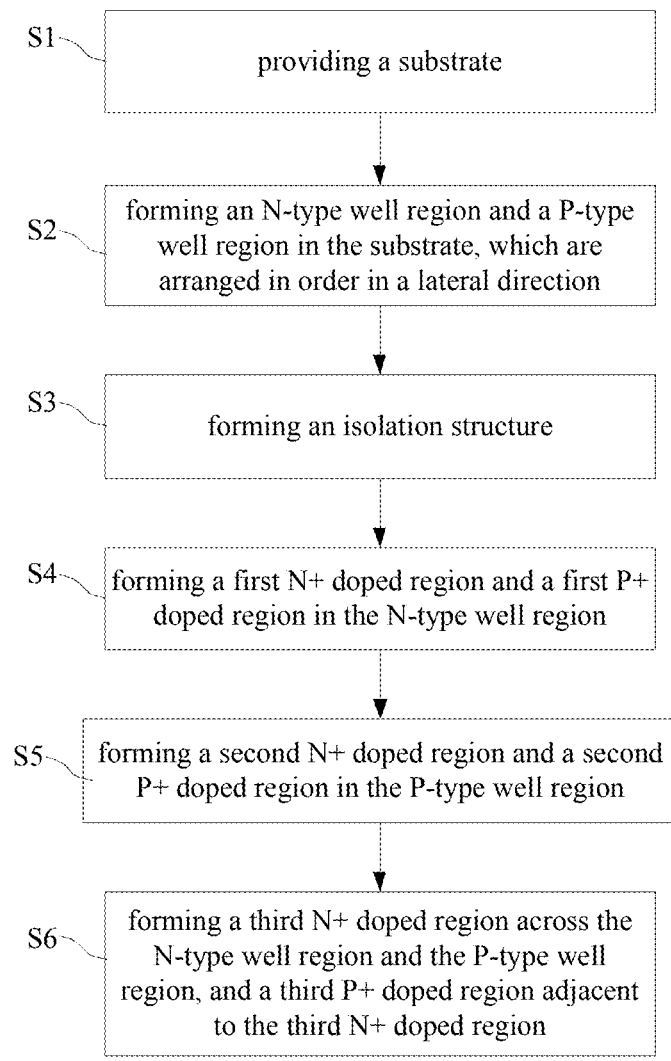
FIG. 7 shows a flow diagram of a manufacturing method of an electrostatic protection device including an SCR according to an embodiment of the present disclosure.

Further, as shown in FIG. 7, the present disclosure also discloses a manufacturing method of an electrostatic protection device including an SCR, which can be used to manufacture and form the electrostatic protection device including the SCR disclosed in any of the above embodiments. The manufacturing method specifically comprises the following steps:

In step S1, a substrate is provided. For example, the substrate 10 is a P-type silicon substrate.

In step S2, an N-type well region and a P-type well region are formed in the substrate in order in a lateral direction. For example, N-type doping is performed for the N-type well regions 20 and P-type doping is performed for the P-type well regions 30, in different regions of the surface of the substrate 10 in the lateral direction.

In step S3, an isolation structure is formed.

The isolation structure may be a field oxide structure or a shallow trench isolation structure, and the isolation structure can be formed by a conventional process. Taking the field oxide structure as an example, for example, an oxide layer is firstly deposited on the surface of substrate 10, then a hard mask is provided and is used for etching, then a field oxide is grown at a high temperature, and finally, the hard mask is removed. The details of the process are not limited for the present disclosure.

In step S4, a first N+ doped region and a first P+ doped region are formed in the N-type well region. As an example, N-type and P-type ions are implanted respectively in different regions of the N-type well region 20 to form a first N+ doped region 21 and a first P+ doped region 22. In this embodiment, the first N+ doped region 21 and the first P+ doped region 22 are arranged laterally from left to right along the surface of the substrate 10.

In step S5, a second N+ doped region and a second P+ doped region are formed in the P-type well region. For example, N-type and P-type ions are implanted in different regions of the P-type well region 30 to form a second N+ doped region 31 and a second P+ doped region 32. In this embodiment, the second N+ doped region 31 and the second P+ doped region 32 are arranged laterally from left to right along the surface of the substrate 10.

In step S6, a third N+ doped region is formed across the N-type well region and the P-type well region, and a third P+ doped region is formed to be adjacent to the third N+ doped region.

In the present disclosure, the step S6 specifically includes: forming a polysilicon gate 40 on an upper surface of the substrate 10; N-type and P-type ions are implanted on opposite sides of the polysilicon gate 40 using the gate as a mask by a self-aligned process, to form a third N+ doped region 23 and a third P+ doped region 33, respectively, see FIG. 5. Each of the third N+ doped region 23 and the third P+ doped region 33 has a doping concentration higher than those of the first N+ doped region 21, the first P+ doped region 22, the second N+ doped region 31 and the second P+ doped region 32, so that the third N+ doped region 23 and the third P+ doped region 33 are heavily doped and form a PN junction structure with a high doping concentration (i.e., a parasitic Zener diode structure). When Zener breakdown occurs in the PN junction structure between the third N+ doped region 23 and the third P+ doped region 33, a breakdown current flows in a horizontal direction parallel to an upper surface of the substrate 10. A voltage drop is generated when the breakdown current flows through a well resistance, which turns on the parasitic bipolar transistor of NPN or the parasitic bipolar transistor of PNP. When one parasitic bipolar transistor is turned on, a voltage drop due to its collector current will immediately turn on the other parasitic bipolar transistor. Finally, two parasitic bipolar transistors operate in an open-circuit positive feedback mechanism, so that the SCR structure in the electrostatic protection device is completely turned on. A low-resistance ESD current path is formed so as to provide electrostatic protection for the protected integrated circuit.

Preferably, in the first embodiment of the present disclosure, the third N+ doped region 23, the polysilicon gate 40, and the third P+ doped region 33 are arranged in order in a lateral direction, and the third P+ doped region 33 is formed in the P-type well region 30. Referring to FIG. 2 FIG. 3 and the foregoing description of the first embodiment, details of the disclosure has been described and will not be repeated here.

In the second embodiment of the present disclosure, the third N+ doped region 23, the polysilicon gate 40, and the third P+ doped region 33 are arranged in order in a longitudinal direction, and each of the third N+ doped region 23, the polysilicon gate 40, and the third P+ doped region 33 are arranged across the N-type well region 20 and the P-type well region 40. Further, in this embodiment, a plurality of polysilicon gates 40 are formed on the upper surface of the substrate 10. Each of the plurality of polysilicon gates 40 is formed with a third N+ doped region 23 and a third P+ doped region 33 at opposite sides by a self-aligned process, respectively. Referring to FIG. 4 FIG. 5 FIG. 6 and the foregoing description of the second embodiment, details of this embodiment are described and will not be repeated here.

Further, a distance between the third N+ doped region 23 and the third P+ doped region 33 is defined by the polysilicon gates 40. The distance between the third N+ doped region 23 and the third P+ doped region 33 is equal to a width of the polysilicon gates 40.

To sum up, the present disclosure relates to some embodiments of an electrostatic protection device including the SCR and a manufacturing method thereof. A third N+ doped region and a third P+ doped region are formed additionally in a conventional electrostatic protection device including an SCR (referred to as SCR device for short herein) structure. The third N+ doped region is arranged across a P-type well region and an N-type well. The third P+ doped region is adjacent to the third N+ doped region. Each of the third N+ doped region and the third P+ doped region has a high doping concentration. Furthermore, a PN junction structure (i.e., a Zener diode structure) between the third N+ doped region with high concentration and the third P+ doped region with high concentration is formed in the electrostatic protection device including the SCR. A current is generated during Zener breakdown of the third N+ doped region with high concentration and the third P+ doped region with high concentration and is used to assist trigger the SCR to form a discharge current path. In this process, a breakdown voltage required by Zener breakdown is lower than that required by avalanche breakdown, and effectively reduces a trigger voltage of the SCR. The whole device has simple structure, high stability and robustness, and has a good application prospect.

In a further preferable embodiment, the third N+ doped region with high concentration and the third P+ doped region with high concentration are formed on opposite sides of a polysilicon gate by a self-aligned process after the polysilicon gate is deposited. Thus, a distance between the third N+ doped region with high concentration and the third P+ doped region with high concentration is accurately defined, which is helpful for obtaining more accurate Zener breakdown voltage. Meanwhile, the distance between the third N+ doped region with high concentration and the third P+ doped region with high concentration can be accurately and stably changed by varying a width of the polysilicon gate. Therefore, the SCR device has the characteristics of high stability and high robustness, and has a trigger voltage (i.e. a Zener breakdown voltage) (i.e. a Zener breakdown voltage) that can be adjusted accurately and stably, which enhances application scenarios of the SCR device.

In a further preferable embodiment, all of the third N+ doped region, the polysilicon gate and the third P+ doped region are arranged in a longitudinal direction across the N-type well region and the P-type well region. An area of the SCR device can be further reduced and the miniaturization of the device can be facilitated.

Finally, it should be noted that the above general description and the following detailed description are only exemplary and explanatory and are not limiting to the present disclosure. Other variations or alterations in different forms may be made on the basis of the above description for those of ordinary skill in the art. There is no need and cannot be an exhaustive list of all embodiments here. However, the obvious changes or variations arising from this are still in the scope of protection of the present disclosure rights.

The invention claimed is:

1. An electrostatic protection device including an SCR, comprising:
   a substrate;
   an N-type well region and a P-type well region in the substrate arranged in order in a lateral direction;
   a first N+ doped region and a first P+ doped region in the N-type well region arranged in order with a distance therebetween, wherein both the first N+ doped region and the first P+ doped region are electrically coupled with an anode of the electrostatic protection device including the SCR;
   a second N+ doped region and a second P+ doped region in the P-type well region arranged in order and with a distance therebetween, wherein both the second N+ doped region and the second P+ doped region are electrically coupled with a cathode of the electrostatic protection device including the SCR;
   a third N+ doped region across the N-type well region and the P-type well region;
   a third P+ doped region adjacent to the third N+ doped region,
   wherein each of the third N+ doped region and the third P+ doped region has a doping concentration higher than those of the first N+ doped region, the first P+ doped region, the second N+ doped region and the second P+ doped region;
   in a case that Zener breakdown occurs in the PN junction structure between the third N+ doped region and the third P+ doped region, an SCR is triggered to form a discharge current path.

2. The electrostatic protection device including the SCR according to claim 1, wherein the shorter a distance between the third N+ doped region and the third P+ doped region, the lower a Zener breakdown voltage of the PN junction structure between the third N+ doped region and the third P+ doped region.

3. The electrostatic protection device including the SCR according to claim 2, further comprising: a polysilicon gate arranged on an upper surface of the substrate and between the third N+ doped region and the third P+ doped region,
   wherein a distance between the third N+ doped region and the third P+ doped region is defined by the polysilicon gate.

4. The electrostatic protection device including the SCR according to claim 3, wherein the distance between the third N+ doped region and the third P+ doped region is equal to a width of the polysilicon gate.

5. The electrostatic protection device including the SCR according to claim 3, wherein the third N+ doped region, the polysilicon gate and the third P+ doped region are arranged in order in a lateral direction, and the third P+ doped region is located in the P-type well region.

6. The electrostatic protection device including the SCR according to claim 3, wherein the third N+ doped region, the polysilicon gate and the third P+ doped region are arranged in order in a longitudinal direction, and each of the third N+ doped region, the polysilicon gate and the third P+ doped region is arranged across the N-type well region and the P-type well region.

7. The electrostatic protection device including the SCR according to claim 6, wherein at least one of the third N+ doped region and the third P+ doped region includes a plurality of doped regions, such that the PN junction structure between the third N+ doped regions and the third P+ doped regions arranged in a longitudinal direction includes a plurality of PN junctions, and, the polysilicon gates are arranged between any adjacent ones of the third N+ doped regions and the third P+ doped regions.

8. The electrostatic protection device including the SCR according to claim 1, further comprising isolation structures which isolate the first N+ doped region from the first P+ doped region, isolate the first P+ doped region from the third N+ doped region, isolate the third P+ doped region from the second N+ doped region, and isolate the second N+ doped region from the second P+ doped region, wherein the isolation structures are ones selected from a group consisting of a field oxide structure and a shallow trench isolation structure.

9. A method for manufacturing an electrostatic protection device including an SCR, comprising:
   providing a substrate;
   forming an N-type well region and a P-type well region in the substrate, which are arranged in order in a lateral direction;
   forming an isolation structure;
   forming a first N+ doped region and a first P+ doped region in the N-type well region;
   forming a second N+ doped region and a second P+ doped region in the P-type well region;
   forming a third N+ doped region across the N-type well region and the P-type well region, and a third P+ doped region adjacent to the third N+ doped region,
   wherein each of the third N+ doped region and the third P+ doped region has a doping concentration higher than those of the first N+ doped region, the first P+ doped region, the second N+ doped region and the second P+ doped region.

10. The method of manufacturing the electrostatic protection device including the SCR according to claim 9, wherein forming a third N+ doped region across the N-type well region and the P-type well region, and a third P+ doped region adjacent to the third N+ doped region comprises:
   forming a polysilicon gate on an upper surface of the substrate;
   forming the third N+ doped region and the third P+ doped region on opposite sides of the polysilicon gate in a self-aligned process,
   wherein a distance between the third N+ doped region and the third P+ doped region is defined by the polysilicon gate.

11. The method of manufacturing the electrostatic protection device including the SCR according to claim 10, wherein the distance between the third N+ doped region and the third P+ doped region is equal to a width of the polysilicon gate.

12. The manufacturing method of the electrostatic protection device including the SCR according to claim 10, wherein the third N+ doped region, the polysilicon gate and the third P+ doped region are arranged in order in a lateral direction, and the third P+ doped region is formed in the P-type well region.

13. The manufacturing method of the electrostatic protection device including the SCR according to claim 10, wherein the third N+ doped region, the polysilicon gate and the third P+ doped region are arranged in order in a longitudinal direction, and each of the third N+ doped region, the polysilicon gate and the third P+ doped region is arranged across the N-type well region and the P-type well region.

14. The manufacturing method of the electrostatic protection device including the SCR according to claim 13, wherein a plurality of polysilicon gates are formed on the upper surface of the substrate, and a third N+ doped region and a third P+ doped region are formed by a self-aligned process on opposite sides of each of the plurality of polysilicon gates.

15. The method of manufacturing the electrostatic protection device including the SCR according to claim 9, wherein the isolation structure is a field oxide structure or a shallow trench isolation structure.

* * * * *